United States Patent
Ishida et al.

(10) Patent No.: US 7,470,944 B2
(45) Date of Patent: Dec. 30, 2008

(54) SOLID-STATE IMAGE SENSOR

(75) Inventors: Tomohisa Ishida, Tokyo (JP); Atsushi Kamashita, Kawasaki (JP); Satoshi Suzuki, Tokyo (JP)

(73) Assignee: Nikon Corporation, Tokyo (JP)

( * ) Notice: Subject to any disclaimer, the term of this patent is extended or adjusted under 35 U.S.C. 154(b) by 97 days.

(21) Appl. No.: 11/007,284

(22) Filed: Dec. 9, 2004

(65) Prior Publication Data

US 2005/0104100 A1   May 19, 2005

Related U.S. Application Data

(63) Continuation of application No. PCT/JP03/07648, filed on Jun. 17, 2003.

(30) Foreign Application Priority Data

Jun. 26, 2002   (JP) .............................. 2002-186590

(51) Int. Cl.
*H01L 21/84* (2006.01)

(52) U.S. Cl. ........................ 257/292; 257/189; 257/446; 257/E27.133

(58) Field of Classification Search ................. 257/433, 257/436, 445, 446, 452, 292, 291, 293, 294, 257/189, E21.318, E27.131, E27.132, E27.133
See application file for complete search history.

(56) References Cited

U.S. PATENT DOCUMENTS

| | | | |
|---|---|---|---|
| 3,874,936 A | 4/1975 | d'Hervilly et al. | |
| 4,766,086 A | 8/1988 | Ohshima et al. | |
| 5,098,852 A * | 3/1992 | Niki et al. | 438/143 |
| 5,250,445 A | 10/1993 | Bean et al. | |
| 5,453,385 A * | 9/1995 | Shinji | 438/143 |
| 5,861,655 A * | 1/1999 | Kozuka et al. | 257/446 |
| 6,351,001 B1 * | 2/2002 | Stevens et al. | 257/223 |
| 6,518,085 B1 * | 2/2003 | Wang et al. | 438/70 |
| 6,524,928 B1 * | 2/2003 | Hirabayashi | 438/402 |
| 6,576,940 B2 * | 6/2003 | Maeda | 257/292 |
| 2003/0170928 A1 * | 9/2003 | Shimozono et al. | 438/73 |

FOREIGN PATENT DOCUMENTS

| | | |
|---|---|---|
| DE | 4021377 A1 | 1/1991 |
| DE | 43 29 837 A1 | 3/1995 |

(Continued)

OTHER PUBLICATIONS

LSI Handbook; Japanese Institute of Electronics; Information and Communication Engineers; 1st Edition; pp. 358-364.

*Primary Examiner*—Thomas L Dickey
*Assistant Examiner*—Fazli Erdem
(74) *Attorney, Agent, or Firm*—Oliff & Berridge, PLC

(57) ABSTRACT

A solid-state image sensor of the present invention has a plurality of pixel cells that generate signal charges in accordance with incident light. It is characterized by having a gettering region within the area of a pixel cell. The gettering region, which is disposed closely to the photoelectrical conversion layer, makes direct and efficient use of gettering capability in the pixel region in the solid-state image sensor. As a result, it is possible to effectively eliminate metal contaminant contained in the pixel region, thereby remarkably reducing dark outputs occurring from the metal contaminant.

6 Claims, 8 Drawing Sheets

FOREIGN PATENT DOCUMENTS

| | | |
|---|---|---|
| EP | 0 908 956 A2 | 4/1999 |
| JP | A-04-206932 | 7/1992 |
| JP | A-05-110053 | 4/1993 |
| JP | A-06-342798 | 12/1994 |
| JP | 11-307752 * | 11/1999 |
| JP | A-11-307752 | 11/1999 |
| JP | A-2001-135816 | 5/2001 |
| JP | A-2002-043557 | 2/2002 |
| JP | A-2002-165132 | 6/2002 |

* cited by examiner

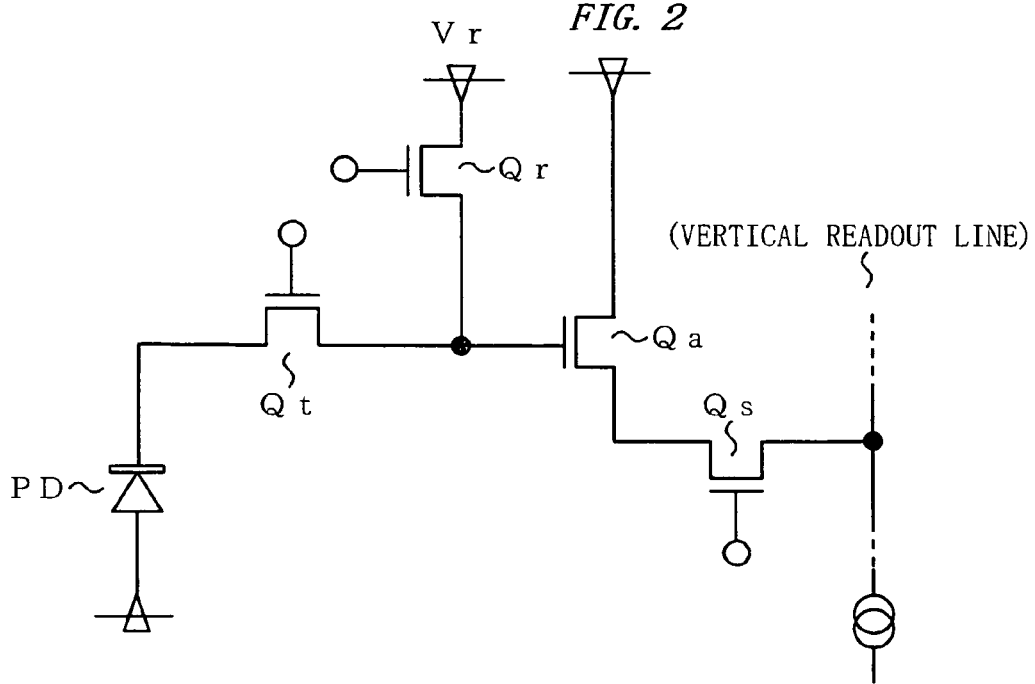
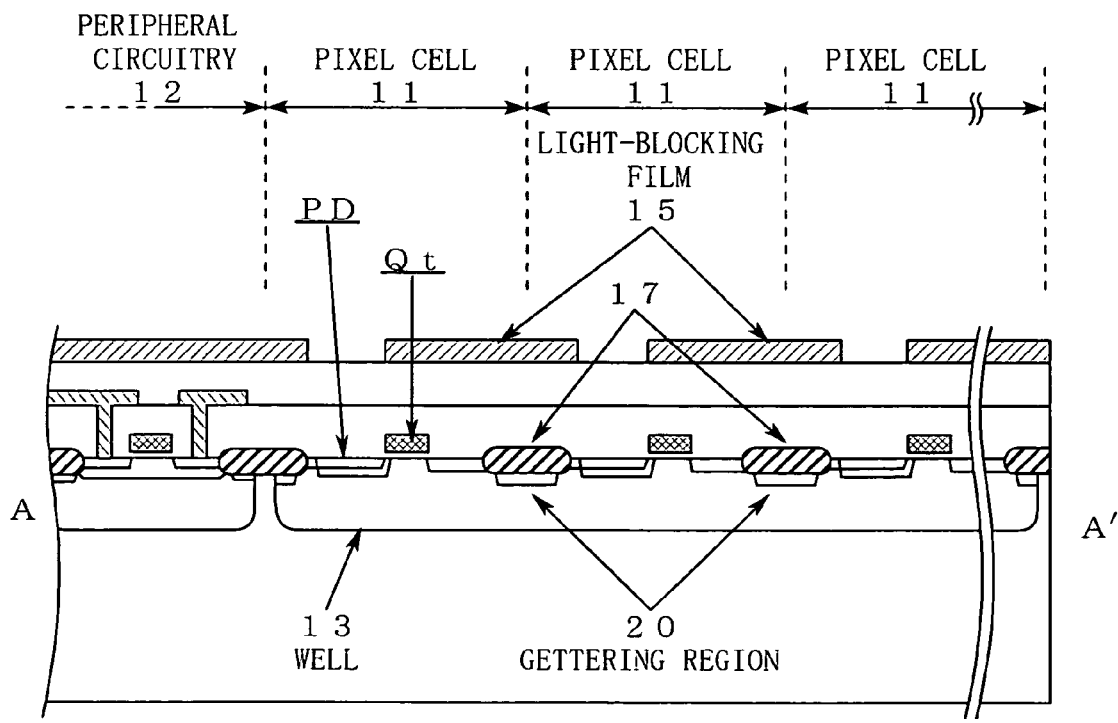

SOLID-STATE IMAGE SENSOR

CROSS REFERENCE TO RELATED APPLICATION

This application is a continuation application of International Application PCT/JP03/07648, filed Jun. 17, 2003, and designating the U.S.

BACKGROUND OF THE INVENTION

1. Field of the Invention

The present invention relates to a solid-state image sensor which includes a plurality of pixel cells that generate signal charges in accordance with incident light.

2. Description of the Related Art

A gettering technique has been a known technique to form a gettering layer on the reverse side of a semiconductor wafer so as to collect and capture metallic contaminants present thereon. The background of such a gettering technique is described in LSI Handbook, Japanese Institute of Electronics, Information and Communication Engineers, first printing of first edition, pp 358-364, published by Ohm-sha.

Also, Japanese Unexamined Patent Application Publication No.2002-43557 describes an example in which the gettering technique is applied to a solid-state image sensor. Herein, gettering layers are stacked outside a well (mainly under the well) that surrounds a pixel region.

If a solid-state image sensor is contaminated with metal or the like, in general, a dark output occurs from the contaminated area, thereby reducing the S/N of an image signal.

In particular, the metal contamination is conspicuous in a pixel region formed in an epitaxial layer. Contaminants of such metallic impurities include metals in a material gas for epitaxial growth or those used for processing equipment (such as gas conduits). The dark output derived from the metallic impurities directly acts upon the pixel region in the epitaxial layer, whereby the S/N of an image signal is significantly reduced.

In this context, the inventors of the present application made experiments on contamination with iron in the processing step, which is a main factor of the dark output and often used in processing equipment. In the experiments, solid iron was dissolved on a silicon substrate which had been heated to 900° C. The result was that the substrate was contaminated with the iron from its surface up to a depth of 5 µm, which may cause degradation in device characteristics such as the dark output.

According to the experiment results, it can be assumed that the metal contamination occurring in the processing steps of the solid-state image sensor is to have direct effects on the pixel region in the vicinity of the surface.

However, the gettering layer is formed on the reverse side of the substrate or under the well by the aforementioned conventional gettering technique. This causes a problem that gettering capability is not sufficient in the pixel region which is intensively contaminated with metal because the gettering layer is substantially spaced away from the pixel region (the substrate surface).

With the progress of device miniaturization of the solid-state image sensor, in particular, the overall gettering capability reduces as temperature in the processes lowers, so that the contamination cannot be sufficiently eliminated from the pixel region.

SUMMARY OF THE INVENTION

It is therefore an object of the present invention to provide an effective gettering technique for eliminating contamination from the solid-state image sensor (the pixel region). Now, the present invention will be described below.

(1) A solid-state image sensor according to the present invention includes a plurality of pixel cells which generate signal charges in accordance with incident light. A gettering region is provided in an area of at least a part of the plurality of pixel cells.

(2) it is preferable that the plurality of pixel cells are formed in a well provided on a semiconductor substrate. The gettering region is provided inside the well.

(3) It is preferable that the gettering region is provided independently in each of the pixel cells.

(4) It is preferable that the gettering region is formed at a depth substantially equal to that of a layer in which photoelectrical conversion is performed for the pixel cells.

(5) It is preferable that the gettering region is provided in an area of the pixel cells where light is blocked.

(6) It is preferable that the gettering region has an average impurity concentration of $1E20\ cm^{-3}$ or more.

(7) It is preferable that in the gettering region an average area concentration of iron is $1E10\ cm^{-2}$ or more.

(8) It is preferable that the gettering region is a region where lattice defects are present.

(9) It is preferable that the gettering region contains at least one of boron, phosphorus, arsenic, and antimony as an impurity.

(10) It is preferable that the gettering region is provided at a location to which a constant voltage is applied.

(11) It is preferable that the gettering region and a region in contact with a metal conductor are provided in an area of at least a part of the pixel cells.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 2 is a view showing an equivalent circuit of a pixel cell 11;

FIG. 3 is a cross-sectional view taken along the line A-A' shown in FIG. 1;

DESCRIPTION OF THE PREFERRED EMBODIMENTS

Now, embodiments according to the present invention will be described below with reference to the accompanying drawings.

First Embodiment

Figure 1:
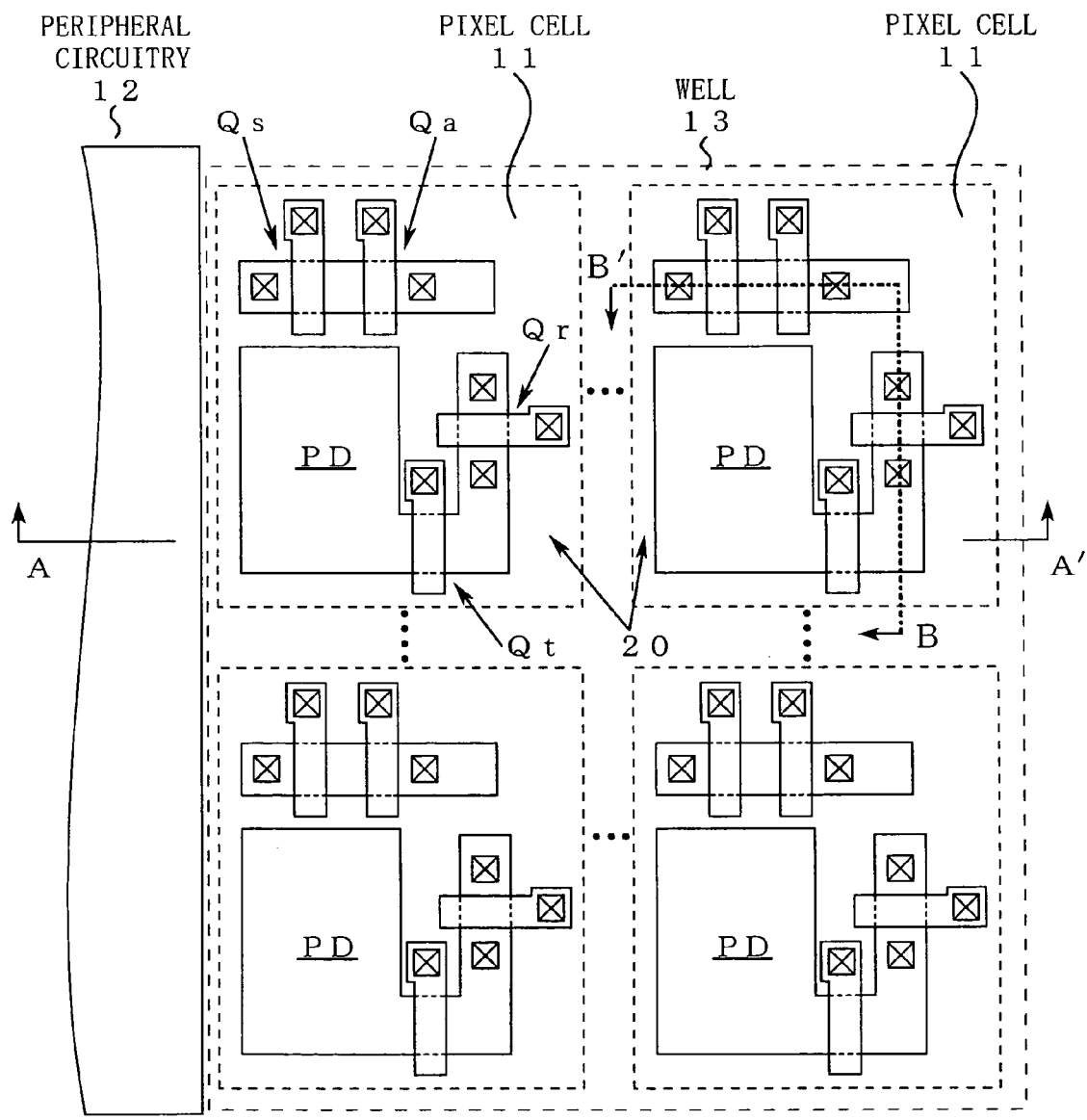
FIG. 1 is a view showing the configuration of a light-receiving face of a solid-state image sensor 10.

FIG. 1 is a view showing the configuration of a light-receiving face of a solid-state image sensor 10.

As shown in FIG. 1, the solid-state image sensor 10 generally includes pixel cells 11 arranged in an array and peripheral circuitry 12 having a vertical scan circuit or the like. The plurality of pixel cells 11 are formed inside a well 13.

FIG. 2 is a view showing an equivalent circuit of the pixel cell 11.

The pixel cell 11 has the following elements formed therein by patterning:

(1) A photodiode PD for photoelectric conversion of incident light into signal charges;

(2) A MOS switch Qr for reset operations;

(3) A MOS switch Qt for reading signal charges from the photodiode PD;

(4) An amplification element Qa for converting the read signal charges into a voltage signal; and (5) A MOS switch Qs for selecting an output row.

FIG. 3 is a cross-sectional view taken along the line A-A' shown in FIG. 1.

As shown in FIG. 3, the surface of the pixel cells 11 is covered with a light-blocking film 15 except the opening of the photodiode PD.

A field oxidation film 17 is formed as appropriate on regions other than the circuit elements of the pixel cells 11 so as to separate and isolate neighboring pixel cells 11 from each other. A gettering region 20 is formed under the field oxidation film 17. The gettering region 20 is a region with a impurity concentration in which the average impurity concentration of such as boron meets the following equation.

$$1E20 \text{ cm}^{-3} \leq \text{Average impurity concentration} \leq 1E23 \text{ cm}^{-3}.$$

The upper limit $1E23 \text{ cm}^{-3}$ is substantially equal to the concentration of metal boron. The grounds for the lower limit $1E20 \text{ cm}^{-3}$ will be explained in detail below with reference to experimental data.

Inside the gettering region 20 lattice defects such as dislocation loops, stacking faults, or vacancies are present. Because the lattice defects are present within the gettering region 20 but not in the depletion region of the photodiode PD, it is thus less likely to cause leak current in the photodiode PD.

Such a gettering region 20 captures iron contaminants; as a result, an average area concentration of iron therein is $1E10 \text{ cm}^{-2}$ or more.

To form such a gettering region 20, for example, boron may be introduced by ion implantation before the field oxidation film 17 is formed and then annealed in an atmosphere of nitrogen (at 950° C., for 30 minutes). After this treatment, oxidation is performed at a high temperature of about 1000° C. to form a thick field oxidation film 17 on the gettering region 20.

To form the gettering region 20 in an alternative manner, boron may be introduced to a region under the field oxidation film 17 through the field oxidation film 17 by the high energy ion implantation.

Effects of the First Embodiment

The aforementioned gettering region 20 has the following features.

(A) The gettering region 20 is provided within a region (or in a plurality of layers) in which the pixel cells 11 are formed as circuits. Accordingly, as compared with the aforementioned conventional technique, the distance between the gettering region 20 and the pixel cells 11 is substantially reduced, thereby achieving a higher gettering effect for the pixel cells 11. As a result, the gettering region 20 achieves a great gettering effect on the pixel cells 11 which are vulnerable to metal contamination, increasing the S/N of the solid-state image sensor 10 easily.

(B) The gettering region 20 is present inside the well 13 that surrounds the pixel cells 11. Accordingly, the gettering region 20 directly acts upon the pixel cells 11 from inside the well 13 to attain a further enhanced gettering effect.

(C) The gettering region 20 is formed at a depth substantially equal to that of the depletion region of the photodiode PD. Therefore, it is possible to attain a high gettering effect on the depletion region of the photodiode PD. This causes contaminant metal present in the depletion region of the photodiode PD to be greatly eliminated, thereby making it possible to significantly reduce dark outputs occurring in this depletion region. Consequently, the S/N of the solid-state image sensor 10 can be surely enhanced.

(D) The gettering region 20 is provided at a location where light is blocked with the light-blocking film 15. For this reason, even while the solid-state image sensor 10 is being illuminated with light, the gettering region 20 is maintained in a dark state. Generally, heavy metal donors which pair with boron in the gettering region 20 are partially separated when illuminated with white light. However, in this embodiment, the gettering region 20 are maintained in a dark state so that separation of captured metal is to be less, thereby making it possible to obtain a more stable continuous gettering effect.

(E) Lattice defects are present in the gettering region 20. Irregular structures of lattice defects cause lattice strain on the surrounding crystalline. The lattice strain serves as the gettering center of heavy metals. Accordingly, the gettering region 20 can capture metal contaminants more effectively by the gettering effect of the lattice strain.

(F) In particular, the gettering region 20 here can be a region not in contact with metal conductor. Such a gettering region 20 is able to be positioned more freely irrespective of the patterning of metal conductor. It is thus possible to place the gettering region 20 as appropriate in the vicinity of the depletion region of the photodiode PD. In this case, it is possible to make an intensive and efficient gettering effect on this depletion region. As a result, dark outputs which would otherwise occur in this depletion region can be effectively reduced to attain an efficiently enhanced S/N for the solid-state image sensor 10.

Now, another embodiment will be described.

Second Embodiment

The structure of a pixel cell according to the second embodiment is the same as that of the first embodiment (FIGS. 1 and 2), and thus will not be repeatedly described.

Figure 4:
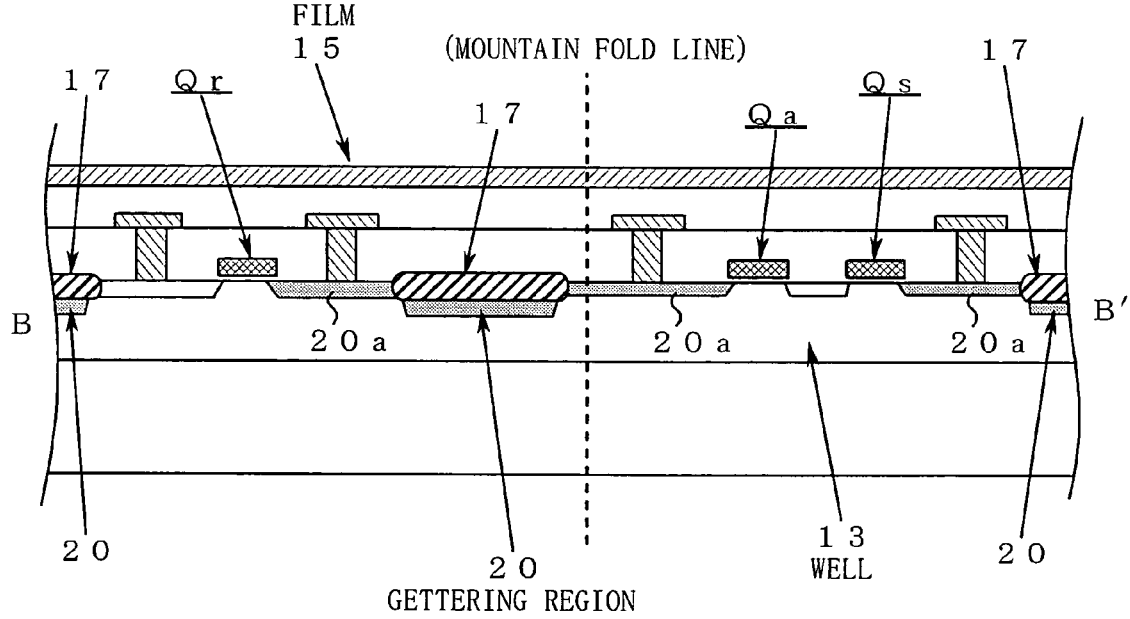
FIG. 4 is a cross-sectional view taken along line B-B' shown in FIG. 1.

FIG. 4 is a cross-sectional view taken along the line B-B' shown in FIG. 1.

As shown in FIG. 4, in the second embodiment, a gettering region 20*a* is provided in the region of the MOS switch Qr (to which a reset voltage is applied), the drain region of the amplification element Qa, and the region of the MOS switch Qs (which is connected to the vertical readout line). In particular, one of these regions which is in ohmic contact with the metal conductor may also be referred to as a contact region to distinguish it from the gettering region which is not in ohmic contact with the metal conductor. In these gettering regions 20*a*, an impurity such as phosphorus is introduced with an average impurity concentration of $1E20\ cm^{-3}$ or more.

Also, inside the gettering region 20*a* lattice defects such as dislocation loops, stacking faults, or vacancies are present.

To form such a gettering region 20*a*, for example, phosphorus may be introduced from the surface of a semiconductor substrate by ion implantation, and thereafter annealed for activation, for example, in an atmosphere of nitrogen at a temperature of 950° C. or less for about 30 minutes.

Such a gettering region 20*a* captures iron contaminants so that the average area concentration of iron is $1E10\ cm^{-2}$ or more therein.

Effects of the Second Embodiment

As described above, the second embodiment provides an additional gettering region 20*a*. It is therefore possible to further enhance the gettering effect described in relation to the first embodiment.

Now, another embodiment will be described below.

Third Embodiment

Figure 5:
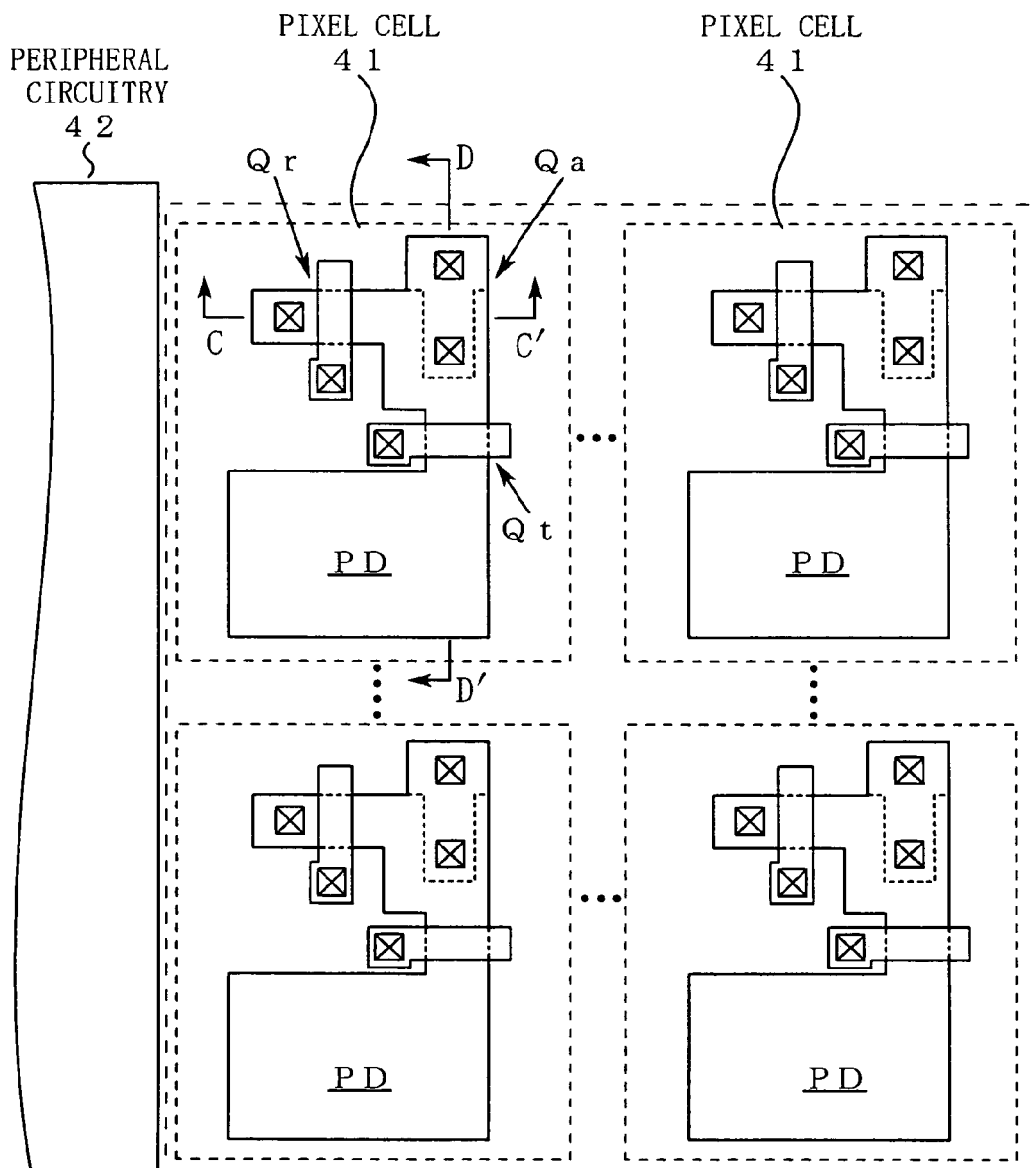
FIG. 5 is a view showing the configuration of a light-receiving face of a solid-state image sensor 30.

FIG. 5 is a view showing the configuration of a light-receiving face of a solid-state image sensor 30.

As shown in FIG. 5, the solid-state image sensor 30 includes pixel cells 41 arranged in an array and peripheral circuitry 42 having a vertical scan circuit or the like.

Figure 6:
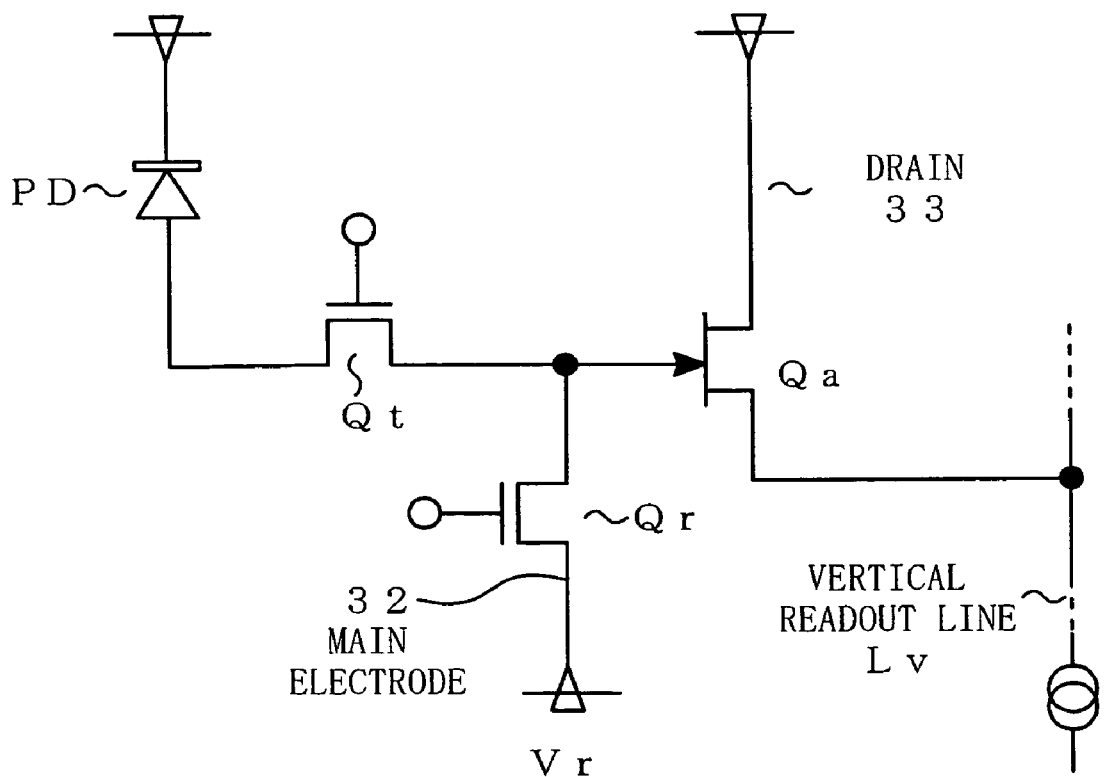
FIG. 6 is a view showing an equivalent circuit of a pixel cell 41.

FIG. 6 is a view showing an equivalent circuit of the pixel cell 41.

The pixel cells 41 are patterned with a photodiode PD for photoelectric conversion of incident light into signal charges, a MOS switch Qt for reading signal charges from the photodiode PD, a MOS switch Qr for reset operations, and an amplification element Qa of a junction type FET for converting the read signal charges into a voltage signal.

Figure 7:
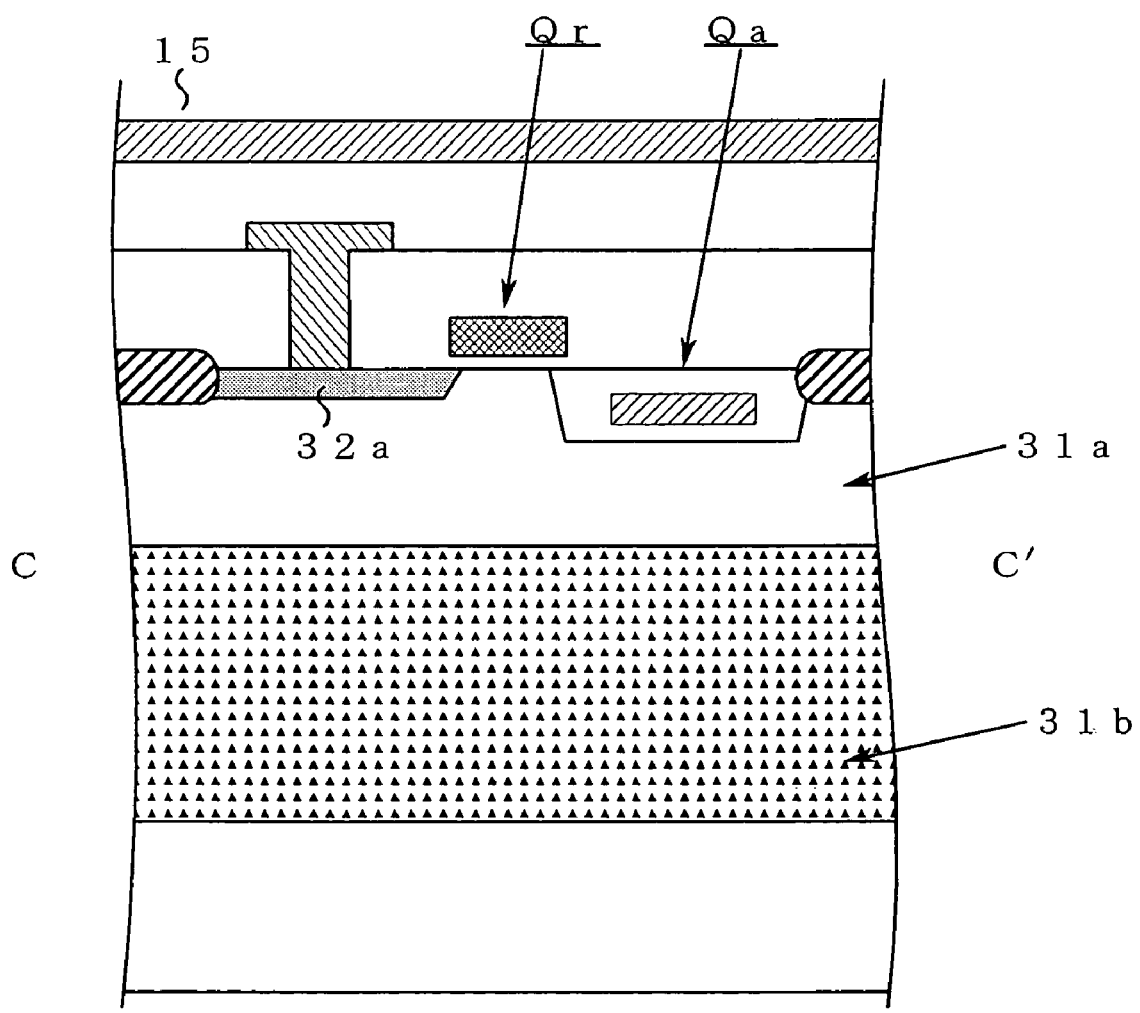
FIG. 7 is a cross-sectional view taken along the line C-C' shown in FIG. 5.

FIG. 7 is a cross-sectional view taken along the line C-C' shown in FIG. 5.

Figure 8:
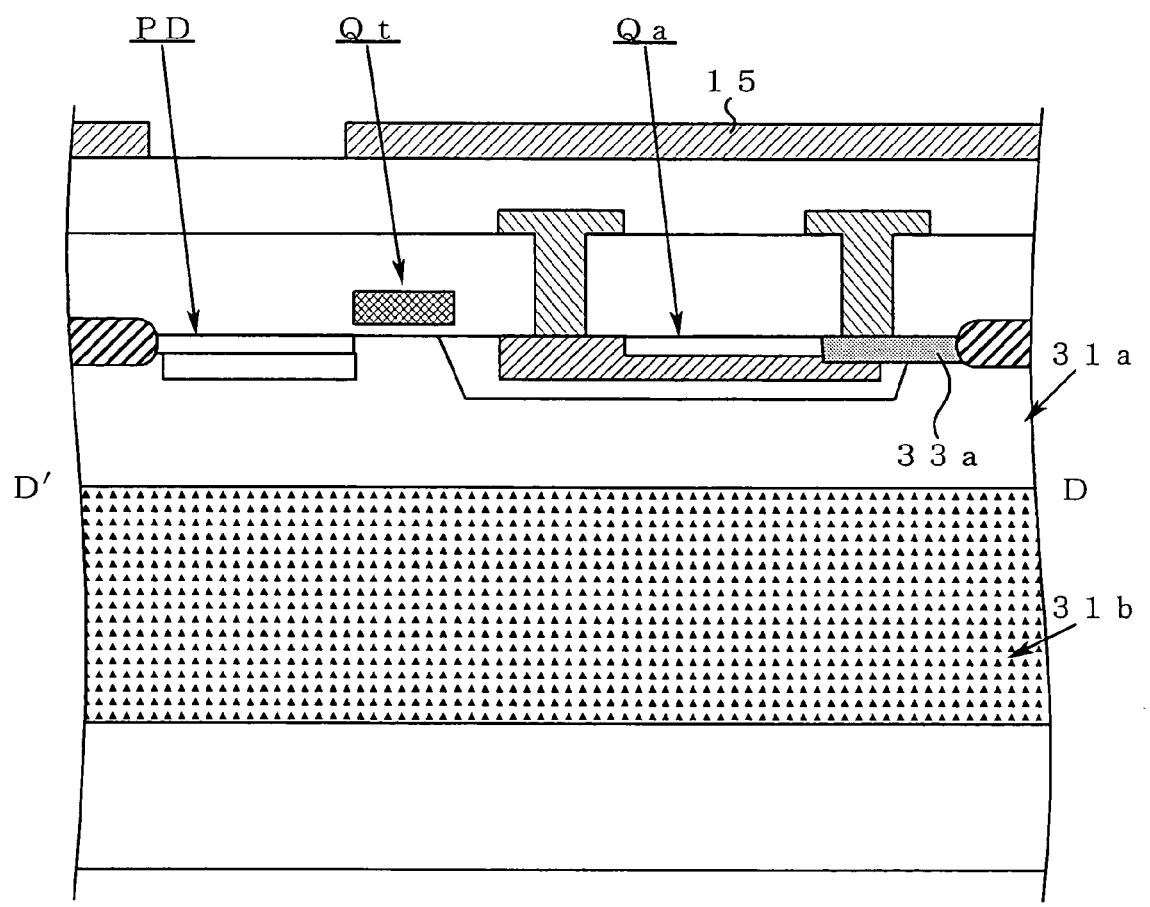
FIG. 8 is a cross-sectional view taken along the line D-D' shown in FIG. 5.

FIG. 8 is a cross-sectional view taken along the line D-D' shown in FIG. 5.

As shown in FIGS. 7 and 8, in the third embodiment, gettering regions 32*a* and 33*a* are provided on a main electrode 32 of the MOS switch Qr (by which a reset voltage is applied) and the drain 33 of the amplification element Qa, respectively. In particular, one of these regions which is in ohmic contact with the metal conductor may also be referred to as a contact region to distinguish it from the gettering region which is not in ohmic contact with the metal conductor.

In the gettering region 32*a*, an impurity such as boron is introduced with an average impurity concentration of $1E20\ cm^{-3}$ or more. On the other hand, in the gettering region 33*a*, an impurity such as phosphorus is introduced with an average impurity concentration of $1E20\ cm^{-3}$ or more.

Furthermore, inside the gettering regions 32*a* and 33*a* lattice defects such as dislocation loops, stacking faults, or vacancies are present.

To form these gettering regions 32*a* and 33*a*, for example, boron fluoride or phosphorus may be introduced by ion implantation, and thereafter annealed in an atmosphere of nitrogen at a temperature of 950° C. or less for about 30 minutes.

Such gettering regions 32*a* and 33*a* capture iron contaminants so that the average area concentration of iron is $1E10\ cm^{-2}$ or more therein.

In the third embodiment, the semiconductor substrate is subjected to intrinsic gettering (IG), which is one conventional technique, to form a micro-defect region (Bulk Micro Default BMD) 31*b* and a no-defect region (DZ region) 31*a* on the surface of the substrate.

The micro-defect region 31*b* is able to capture metal contaminants from below the pixel cells 41, thereby providing a more positive gettering effect.

Effects of the Third Embodiment

In the third embodiment, the gettering regions 32*a* and 33*a* can provide the same effects as those of the first embodiment.

The third embodiment also provides three additional effects as follows.

(1) In general, the size of the gettering layer is large in the conventional gettering technique since the gettering layer is provided for each substrate or each well. In addition to being large in size, such a gettering layer also contains impurities and defects with a high concentration so that it is difficult to prevent adverse effects on the device structure, function, and operation of the pixel cells. For this reason, in the conventional technique, it is necessary to design a gettering layer and a pixel cell with sufficient distance between them.

However, in this embodiment, the gettering regions 32*a* and 33*a* are designed to be provided for each pixel cell 41. This makes it possible to locally dispose a gettering region selectively in an area not to have influence on the device structure, function, or operation of the pixel cell 41. As a result, it is possible to surely reduce adverse effects on the device structure, function, or operation of the pixel cell 41 while exerting an enhanced gettering effect on the pixel cell 41.

(2) In the third embodiment, the gettering regions 32*a* and 33*a* are formed in part of the area of circuit elements that constitute the pixel cell 41. This may cause a part of the original area to slightly increase in size; however, there is no need to provide an additional area designated for the gettering region. Accordingly, even though the gettering regions 32*a* and 33*a* are additionally provided within the limited area of the pixel cell 41, it causes almost no problems such as unnecessary increases in size of the pixel cell 41 and in the chip size, and a reduction in effective light-receiving area.

(3) In the third embodiment, the gettering regions 32*a* and 33*a* are provided at a selected location where a constant voltage is applied. More specifically, it is possible to apply a constant voltage using polysilicon or silicide.

Such a location is sustained at a low impedance as a circuit by a constant voltage circuit or ground line. This makes it possible to immediately absorb a dark current which is generated by a contaminant captured within the gettering regions 32a, 33a. As a result, it is possible to surely confine a dark current which is generated by a captured contaminant, and to further improve the S/N of an image signal.

In the third embodiment, the gettering region is disposed selectively at a location where a constant voltage is originally applied; however, the present invention is not limited thereto. If a new gettering region is created, an additional constant voltage line may be connected via a conductor to the new gettering region.

Experimental Data

Now, the relation between the average impurity concentration in a gettering region according to the present invention and the dark output from a solid-state image sensor will be verified using experimental data.

Now, the procedure of the experiment will be described below. First, as described in the first through third embodiments, a large number of solid-state image sensors are prepared as samples which have a gettering region within the region of a pixel cell. Boron with various concentrations is introduced into the gettering regions of these samples.

Solid iron is dissolved into the samples at a temperature of 900° C. until the maximum solid solubility thereof becomes 4.2E13 cm$^{-3}$. After the iron contamination, the dark output is measured for each sample.

Figure 9:
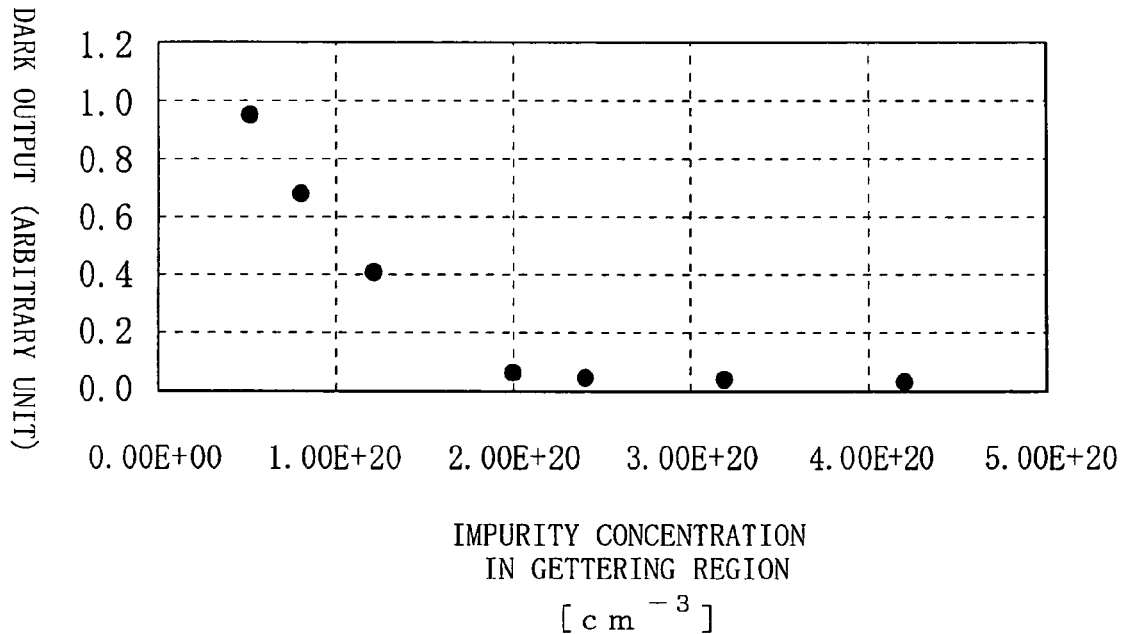
FIG. 9 shows experimental data which represents the relation between the average impurity concentration in gettering region and the dark output from solid-state image sensor.

FIG. 9 is a plot representing the relation between the dark output measured in this manner and the average impurity concentration of boron in the gettering region.

From the experimental results shown in FIG. 9, it can be seen that the dark output is sharply reduced to half when the average impurity concentration of the gettering region is raised up to 1E20 cm$^{-3}$. Around the average impurity concentration of 1E20 cm$^{-3}$, an inflection point appears on the downward curve of the dark output, and the sharp decrease in dark output changes to a slightly gentle decrease. The decrease in dark output further continues even beyond the average impurity concentration of 1E20 cm$^{-3}$, finally reaching to almost zero at the average impurity concentration of 2E20 cm$^{-3}$ (i.e., below the measurement limit).

The experimental results show that the average impurity concentration is preferably set to 1 E20 cm$^{-3}$ or greater (more preferably 2E20 cm$^{-3}$ or greater) when the gettering region is formed within the area of a pixel cell. Setting the average impurity concentration in this way makes it possible to reduce the dark output from the solid-state image sensor to almost half (or almost zero).

It can be estimated from the halved dark output that the gettering region has captured about a half of the iron contaminant in the pixel cell. In this case, the average area concentration of iron within the gettering region will be about 1E10 cm$^{-2}$ by the equation below;

(4.2E13 cm$^{-3}$)×(contamination depth of 5 μm)/ 2≈1E10 cm$^{-2}$.

Therefore, when a region of a pixel cell with a high impurity concentration, which does not contain iron originally, shows a high average area concentration of iron (e.g., 1E10 cm$^{-2}$ or more), it can be determined that the region with a high impurity concentration is the gettering region according to the present invention.

However, needless to say that the average area concentration of iron within the gettering region varies with the amount of iron contaminant. Therefore, it cannot be simply determined that an area with a low average area concentration of iron (e.g., below 1E10 cm$^{-2}$) is not the gettering region according to the present invention.

Supplemental Items of the Embodiments

In the aforementioned embodiments, a gettering region is formed by introducing impurities. This impurity introduction is a particularly preferable technique for locally forming a gettering region as in the aforementioned embodiments. However, the present invention is not limited thereto. For example, the gettering region may also be formed using strains resulting from machining or through the formation of film. Alternatively, the gettering region may be formed by controlling the atmosphere for heat treatment.

In the aforementioned embodiments, the gettering region is formed by introducing boron or phosphorus. Especially, boron is very effective to getter iron which is a main contaminant in the pixel region. However, the present invention is not limited to such an impurity. For example, at least one of boron, phosphorus, arsenic, and antimony is a preferable impurity for forming a gettering region.

As described above, the present invention provides a gettering region within the region of a pixel cell. Accordingly, the gettering region and the pixel cell can be more closely spaced from each other than in the prior art, which provides an enhanced gettering effect on the pixel cell. As a result, it is able to implement a solid-state image sensor with less dark output easily.

The invention is not limited to the above embodiments and various modifications may be made without departing from the spirit and scope of the invention. Any improvement may be made in part or all of the components.

What is claimed is:

1. A solid-state image sensor comprising a plurality of pixel cells each comprising a photodiode for photoelectric conversion of incident light into signal charges, wherein
    said plurality of pixel cells are formed in a well provided on a semiconductor substrate; and
    a gettering region is provided in an area of at least a part of said pixel cells for eliminating contamination with iron up to a depth of 5 μm from said pixel cells, said gettering region is inside said well, provided independently in each of said pixel cells, is formed in part of the area of circuit elements that constitute each pixel cell, and is formed of an impurity having an average impurity concentration of at least 1·10^20 cm $^{-3}$ and containing at least one of boron, boron fluoride, phosphorus, arsenic and antimony at a depth substantially equal to that of a depletion region of the photodiode.

2. The solid-state image sensor according to claim 1, wherein
    said gettering region is provided in an area of said pixel cells where light is blocked by a light-blocking film.

3. The solid-state image sensor according to claim 1, wherein
    said gettering region is a region in which lattice defects are present.

4. The solid-state image sensor according to claim 1, wherein said gettering region is provided at a location to which a constant voltage is applied.

5. The solid-state image sensor according to claim 1, wherein said gettering region and a region in contact with a metal conductor are provided in an area of at least a part of said pixel cells.

6. The solid-state image sensor according to claim 1, characterized in that said pixel cells are patterned with a photodiode, a MOS switch for reading signal charges from the photodiode, a MOS switch for reset operations, an amplification element, and that said gettering region is provided on a main electrode of the MOS switch by which a reset voltage is applied, and the drain of the amplification element.

\* \* \* \* \*